(12) United States Patent
Kurtin et al.

(10) Patent No.: US 11,495,703 B2
(45) Date of Patent: *Nov. 8, 2022

(54) OPTICAL DOWNSHIFTING LAYER

(71) Applicant: OSRAM Opto Semiconductors GmbH, Regensburg (DE)

(72) Inventors: Juanita N. Kurtin, Hillsboro, OR (US); Steven M. Hughes, Salem, VA (US); Alex C. Mayer, Mill Valley, CA (US); Oun-Ho Park, San Jose, CA (US); Georgeta Masson, Lafayette, CA (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/035,398

(22) Filed: Sep. 28, 2020

(65) Prior Publication Data

US 2021/0242358 A1 Aug. 5, 2021

Related U.S. Application Data

(60) Continuation of application No. 15/712,091, filed on Sep. 21, 2017, now Pat. No. 10,840,403, which is a
(Continued)

(51) Int. Cl.
*H01L 31/055* (2014.01)
*C09K 11/56* (2006.01)
*C09K 11/02* (2006.01)

(52) U.S. Cl.
CPC .......... *H01L 31/055* (2013.01); *C09K 11/02* (2013.01); *C09K 11/565* (2013.01); *Y02E 10/52* (2013.01); *Y02E 10/542* (2013.01)

(58) Field of Classification Search
CPC .... C09K 11/025; C09K 11/565; H01L 31/055
See application file for complete search history.

(56) References Cited

U.S. PATENT DOCUMENTS

| 5,990,479 A | 11/1999 | Weiss et al. |
| 7,229,690 B2 | 6/2007 | Chan et al. |

(Continued)

FOREIGN PATENT DOCUMENTS

| EP | 2105968 A1 | 9/2009 |
| KR | 20080017553 A | 2/2008 |

(Continued)

OTHER PUBLICATIONS

Van Sark, W.G.J.H.M., "Enhancement of Solar Cell Performance by Employing Planar Spectral Converters," Applied Physics Letters, vol. 87, 2005, pp. 151117-151117-3.
(Continued)

*Primary Examiner* — C Melissa Koslow
(74) *Attorney, Agent, or Firm* — Elliott, Ostrander & Preston, P.C.

(57) ABSTRACT

The light conversion efficiency of a solar cell is enhanced by using an optical downshifting layer in cooperation with a photovoltaic material. The optical downshifting layer converts photons having wavelengths in a supplemental light absorption spectrum into photons having a wavelength in the primary light absorption spectrum of the photovoltaic material. The cost effectiveness and efficiency of solar cells platforms can be increased by relaxing the range of the primary light absorption spectrum of the photovoltaic material. The optical downshifting layer can be applied as a low cost solution processed film composed of highly absorbing and emissive quantum dot heterostructure nanomaterial embedded in an inert matrix to improve the short wavelength response to the photovoltaic material. The enhanced efficiency provided by the optical downshifting layer per-
(Continued)

mits advantageous modifications to the solar cell platform that enhances its efficiency as well.

13 Claims, 7 Drawing Sheets

Related U.S. Application Data division of application No. 13/536,857, filed on Jun. 28, 2012, now abandoned, which is a continuation of application No. 12/836,511, filed on Jul. 14, 2010, now abandoned.

(60) Provisional application No. 61/225,472, filed on Jul. 14, 2009.

(56) References Cited

U.S. PATENT DOCUMENTS

| | | | |
|---|---|---|---|
| 7,405,002 B2 * | 7/2008 | Ying | C30B 29/60 |
| | | | 428/404 |
| 7,560,859 B2 | 7/2009 | Saito et al. | |
| 8,384,064 B2 | 2/2013 | Akai et al. | |
| 9,425,365 B2 | 8/2016 | Kurtin | |
| 9,666,766 B2 * | 5/2017 | Kurtin | C09K 11/025 |
| 10,763,400 B2 | 9/2020 | Kurtin et al. | |
| 10,840,403 B2 * | 11/2020 | Kurtin | C09K 11/02 |
| 2006/0068154 A1 | 3/2006 | Parce et al. | |
| 2006/0158089 A1 | 7/2006 | Saito et al. | |
| 2006/0169971 A1 * | 8/2006 | Cho | H01G 9/2031 |
| | | | 257/14 |
| 2008/0006069 A1 | 1/2008 | Liao | |
| 2008/0026894 A1 | 1/2008 | Dinca et al. | |
| 2008/0095852 A1 | 4/2008 | Kong et al. | |
| 2008/0121844 A1 | 5/2008 | Jang et al. | |
| 2008/0173886 A1 * | 7/2008 | Cheon | H01L 33/501 |
| | | | 257/98 |
| 2008/0216894 A1 | 9/2008 | Hammond | |
| 2009/0050201 A1 | 2/2009 | Fortmann | |
| 2009/0169971 A1 | 7/2009 | Jiang et al. | |
| 2010/0224823 A1 | 9/2010 | Yin et al. | |
| 2011/0037029 A1 | 2/2011 | Liu et al. | |
| 2011/0068322 A1 | 3/2011 | Pickett et al. | |
| 2011/0220194 A1 | 9/2011 | Kurtin et al. | |
| 2011/0249424 A1 | 10/2011 | Joo et al. | |
| 2012/0305860 A1 | 12/2012 | Kurtin et al. | |
| 2013/0112940 A1 | 5/2013 | Kurtin et al. | |
| 2013/0112941 A1 | 5/2013 | Kurtin et al. | |
| 2013/0112942 A1 | 5/2013 | Kurtin et al. | |
| 2013/0115455 A1 | 5/2013 | Banin et al. | |
| 2014/0049155 A1 | 2/2014 | Kurtin | |
| 2014/0166973 A1 | 6/2014 | Kurtin et al. | |
| 2017/0222098 A1 | 8/2017 | Kurtin et al. | |
| 2018/0138340 A1 | 5/2018 | Kurtin et al. | |

FOREIGN PATENT DOCUMENTS

| | | | |
|---|---|---|---|
| KR | 20100071937 A | | 6/2010 |
| WO | 2009002551 A1 | | 12/2008 |
| WO | 2009041595 A1 | | 4/2009 |
| WO | 2010067296 A1 | | 6/2010 |
| WO | WO 2010/067296 | * | 6/2010 |
| WO | 2011008881 A3 | | 8/2011 |
| WO | 2015026464 A1 | | 2/2015 |

OTHER PUBLICATIONS

Xie, R., et al., "Colloidal InP Nanocrystals as Efficient Emitters Covering Blue to Near-Infrared"; J. Am. Chem. Soc., vol. 129 (50), Nov. 23, 2007, pp. 15432-15433.

Zhelev, Z., et al., "Single Quantum Dot-Micelles Coated with Silica Shell as Potentially Non-Cytotoxic Fluorescent Cell Tracers," J. Am. Chem. Soc., vol. 128 (19), Apr. 21, 2006, pp. 6324-6325.

Advisory Action for U.S. Appl. No. 13/536,857, dated Jun. 16, 2015, 2 pages.

Advisory Action for U.S. Appl. No. 13/972,723, dated Oct. 30, 2015, 3 pages.

Advisory Action for U.S. Appl. No. 15/488,322, dated May 15, 2019, 3 pages.

Advisory Action for U.S. Appl. No. 15/712,091, dated Jan. 28, 2020, 3 pages.

Alivisatos, A. P., "Perspectives on the Physical Chemistry of Semiconductor Nanocrystals," J. Phys. Chem., vol. 100, No. 31, (1996), pp. 13226-13239.

Bao, H., et al., "Shape-controlled assembly of luminescent dumbbell-like CdTe-cystine nanocomposites," IOP Publishing, vol. 18, No. 455701, (2007), pp. 1-5.

Batchelder, J.S. et al., "Luminescent Solar Concentrators 1: Theory of operation and techniques for performance evaluation," Applied Optics, vol. 18, (1979), pp. 3090-3110.

Bawendi, M. G., et al., "The Quantum Mechanics of Larger Semiconductor Clusters ('Quantum Dots')," Annual Review of Physical Chemistry, vol. 41, (1990), pp. 477-496.

Chang, S., et al.,"Preparation and Properties of Tailored Morphology," Monodisperse Colloidal Silica-Cadmium Sulfide Nanocomposites, Journal of the American Chemical Society, vol. 116, (1994), pp. 6739-6744.

Currie, M.J. et al., "High Efficiency Organic Solar Concentrators for Photovoltaics," Science, vol. 321, (2008), pp. 226-228.

Doermbach, K., et al., "Facile synthesis of dumbbell-shaped multi-compartment nanoparticles," 2015, Nanoscale, vol. 7, pp. 9169-9173.

Final Office Action for U.S. Appl. No. 13/536,857, dated Apr. 10, 2015, 11 pages.

Final Office Action for U.S. Appl. No. 13/972,723, dated Aug. 24, 2015, 24 pages.

Final Office Action for U.S. Appl. No. 13/972,723, dated Sep. 23, 2016, 29 pages.

Final Office Action for U.S. Appl. No. 15/488,322, dated Feb. 28, 2019, 26 pages.

Final Office Action for U.S. Appl. No. 15/712,091, dated Nov. 20, 2019, 14 pages.

Ibrahim, I.A.M., et al, "Preparation of spherical silica nanoparticles: Stober silica," Journal of American Science, vol. 6, No. 11,(2010), pp. 985-989.

International Preliminary Report on Patentability for International Patent Application No. PCT/US10/42010 dated Jan. 26, 2012, 9 pages.

International Preliminary Report on Patentability for International Patent Application No. PCT/US14/47380 dated Mar. 3, 2016, 10 pages.

International Search Report and Written Opinion for International Patent Application No. PCT/US14/47380, dated Nov. 12, 2014, 11 pages.

International Search Report and Written Opinion for International Patent Application No. PCT/US2010/042010, dated Jun. 22, 2011, 11 pages.

Jones, B., et al., "Nanocrystalline Luminescent Solar Converters," Photovoltaic Materials, vol. C 266, (Dec. 6, 2004), pp. 1-21.

Kinderman, R. et al., "I-V Performance and Stability of Dyes for Luminescent Plate Concentrators," Journal of Solar Energy Engineering, vol. 129, (2007), pp. 277-282.

Manna, L., et al., "Controlled growth of tetrapod-branched inorganic nanocrystals," Nature Materials, vol. 2, (May 25, 2003), pp. 382-385.

Non-Final Office Action for U.S. Appl. No. 13/536,857, dated Oct. 17, 2014, 16 pages.

Non-Final Office Action for U.S. Appl. No. 13/972,723, dated May 6, 2015, 24 pages.

Non-Final Office Action for U.S. Appl. No. 13/972,723, dated Mar. 8, 2016, 26 pages.

Non-Final Office Action for U.S. Appl. No. 15/488,322, dated Aug. 15, 2019, 16 pages.

Non-Final Office Action for U.S. Appl. No. 15/488,322, dated Feb. 1, 2018, 11 pages.

(56) References Cited

OTHER PUBLICATIONS

Non-Final Office Action for U.S. Appl. No. 15/488,322, dated Jul. 13, 2018, 18 pages.
Non-Final Office Action for U.S. Appl. No. 15/712,091, dated Aug. 16, 2019, 15 pages.
Non-Final Office Action for U.S. Appl. No. 15/712,091, dated Mar. 26, 2020, 8 pages.
Notice of Allowance for U.S. Appl. No. 13/972,723, dated 201701317, 9 pages.
Notice of Allowance for U.S. Appl. No. 15/488,322, dated Jan. 29, 2020, 9 pages.
Notice of Allowance for U.S. Appl. No. 15/488,322, dated Apr. 30, 2020, 8 pages.
Porres, L., et al, "Absolute Measurements of Photoluminescence Quantum Yields of Solutions Using an Integrating Sphere"; Journal of Fluorescence, vol. 16, No. 2, Mar. 2006, pp. 267-272, Springer, US.
Pradhan, N. et al., "Efficient and Color-Tunable Mn-Doped ZnSe Nanocrystal emitters: Control of Optical Performance via Greener Synthetic Chemistry", J. Am. Chem. Soc., vol. 129, (11), 2007, pp. 3339-3347.
Qian, L., et al., "High efficiency photoluminescence from silica-coated CdSe quantum dots"; Appl. Phys. Lett., vol. 94, Issue 7, Feb. 2009, pp. 073112-073112-3.
Restriction Requirement for U.S. Appl. No. 12/836,511, dated Jun. 14, 2012, 7 pages.
Restriction Requirement for U.S. Appl. No. 13/972,723, dated Oct. 23, 2014, 7 pages.
Richards, B.S., "Enhancing the Performance of Silicon Solar Cells via the Application of Passive Luminescence Conversion Layers," Solar Energy Materials & Solar Cells 90, 2006, pp. 2329-2337.
Sato, H. et al.,"Mechanism of Formation of Metal Sulfide Ultrafine Particles in Reverse Micelles Using a Gas Injection Method," Ind. Eng. Chem. Res. 1997 vol. 36, pp. 92-100.
Scher, E. C., et al., "Shape Control and Applications of Nanocrystals," Phil. Trans. R. Soc. Lond. A, 361, Dec. 17, 2002, pp. 241-257.
Selvan, S. T., et al., "Robust, Non-Cytotoxic, Silica-Coated CdSe Quantum Dots with Efficient Photoluminescence"; Advanced Materials, vol. 17, Issue 13, May 4, 2005, pp. 1620-1625.
Sholin, V., et al., "Semiconducting polymers and quantum dots in luminescent solar concentrators for solar energy harvesting," Journal of Applied Physics, vol. 101, No. 12, 2007, pp. 123114-1-123114-9.
Supplemental Notice of Allowance for U.S. Appl. No. 13/972,723, dated Feb. 14, 2017, 4 pages.
Svrcek, V., et al., "Silicon Nanocrystals as Light Converter for Solar Cells," Thin Solid Films 451-452, 2004, pp. 384-388.
Talapin, D. V., et al., "Dynamic Distribution of Growth Rates within the Ensembles of Colloidal II-VI and III-V Semiconductor Nanocrystals as a Factor Governing Their Photoluminescence Efficiency," J. Am. Chem. Soc., 124 (20), Apr. 30, 2002, pp. 5782-5790.
Talapin, D.V., et al., "Seeded Growth of Highly Luminescent CdSe/CdS Nanoheterostructures with Rod and Tetrapod Morphologies", Nanoletters, vol. 7, No. 10, 2007, pp. 2951-2959.
Trupke, T., et al., "Improving Solar Cell Efficiencies by Down-Conversion of High Energy Photons," Journal of Applied Physics, vol. 92, No. 3, 2002, pp. 1668-1674.

\* cited by examiner

Orange Ddots.006.tif
Cal: 6.945pix/nm
10:52 12/10/08
TEM Mode: Imaging 20 nm
HV=200kV
Direct Mag: 145000x
X:-5.4405 Y: 108.0095

OPTICAL DOWNSHIFTING LAYER

CROSS-REFERENCE TO RELATED APPLICATIONS

This application is a continuation of U.S. patent application Ser. No. 15/712,091, filed on Sep. 21, 2017 and issued as U.S. Pat. No. 10,840,403 on Nov. 17, 2020, entitled "Optical Downshifting Layer", which is a divisional of abandoned U.S. patent application Ser. No. 13/536,857, filed on Jun. 28, 2012, entitled "Light Conversion Efficiency Enhanced Solar Cell Fabricated with Downshifting Nanomaterial", which is a continuation of abandoned U.S. patent application Ser. No. 12/836,511, filed on Jul. 14, 2010, entitled "Light Conversion Efficiency Enhanced Solar Cell Fabricated with Downshifting Nanomaterial," which claims the benefit under 35 U.S.C. § 119(e) of U.S. Provisional Patent Application No. 61/225,472, filed Jul. 14, 2009, entitled "Light Conversion Efficiency Enhanced Solar Cell Fabricated with Downshifting Nanomaterial", the entire contents of which are hereby incorporated by reference herein.

COPYRIGHT NOTICE

© 2010 Spectrawatt, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR § 1.71(d).

TECHNICAL FIELD

This disclosure relates to solar cell devices and, in particular, to a solar cell having a photoabsorptive nanomaterial layer that downshifts certain wavelengths of incident light into a wavelength region that is better absorbed by the photovoltaic material of the solar cell.

BACKGROUND INFORMATION

"First generation" solar cells are based on the use of crystalline silicon as the photovoltaic material. These silicon solar cells, which have light conversion efficiency of about 16-21%, currently have the highest light conversion efficiency of solar cells in high-volume production (excluding high-cost III-V inorganic cells intended for use in outer space). However, the cost of electricity from these silicon solar cells is still higher in dollar per watt than most currently available retail peak electricity rates. The cost of electricity per watt generated by a solar cell can generally be changed in either of two ways: the light conversion efficiency of the solar cell can be increased, or the cost of producing the solar cell can be decreased.

FIG. 1A is a graph showing the spectral irradiance versus wavelength, and FIG. 1B shows the maximum fraction of general spectral irradiance utilized by silicon. Due to the band gap of silicon, the maximum fraction of light that can be used is about 44%. Due to thermodynamics and recombination inside the silicon material, the maximum practical attainable light conversion efficiency is about 26%.

The concept of enhancing solar cell performance by employing spectral converters has been proposed. Downconversion techniques are disclosed by Trupke, T. and Green, M. A., "Improving solar cell efficiencies by downconversion of high energy photons," *Journal of Applied Physics*, v. 92, no. 3, Pgs. 1668-1674 (2002) and by Richards, B. S., "Enhancing the performance of silicon solar cells via the application of passive luminescence conversion layers," *Solar Energy Materials & Solar Cells* 90, Pgs. 2329-2337 (6) Downconversion generally refers to the absorption of one high energy photon and the subsequent emission of multiple low energy photons, such that overall photon energy is conserved.

Also, the concept of absorption and re-emission of one photon, with the loss to heat of the difference in energy between photons (hereafter referred to as "downshifting," not to be confused with downconversion) has been proposed. Batchelder, J. S. et al., "Luminescent Solar Concentrators: 1) Theory of Operation and Techniques for Performance Evaluation," *Applied Optics* 18, Pgs. 3090-3110 (1979) and Currie, M. J., et al., "High Efficiency Organic Solar Concentrators for Photovoltaics," *Science* 321, Pgs. 226-228 (2008) describe past wavelength conversion approaches, which have been based largely on dyes that have very high luminescence quantum efficiencies but have limited spectral tunability and degrade rapidly. Such limited spectral tunability and rapid degradation are discussed by Kinderman, R., et al., "I-V Performance and Stability of Dyes for Luminescent Plate Concentrators," *Journal of Solar Energy Engineering* 129, Pgs. 277-282 (2007). Dyes also typically have a very large overlap between their absorption and emission spectrum, such that self-absorption losses are significant.

Use of a CdSe quantum dots (QD) as a converting material has been proposed by Van Sark, W. G. J. H. M., "Enhancement of Solar Cell Performance by Employing Planar Spectral Converters," *Applied Physics Letters* 87, 151117 (2005).

Other materials that have been tested as wavelength converters include silicon nanocrystals, such as those described by Svrcek, V., et al., "Silicon Nanocrystals as Light Converter for Solar Cells," *Thin Solid Films* 451-452, Pgs. 384-388 (2004). These materials also have disadvantages.

More cost-effective solar cell technology is, therefore, still desirable.

SUMMARY OF THE DISCLOSURE

The light conversion efficiency of a solar cell can be increased by employing a downshifting nanomaterial to supplement the activity of a photovoltaic material.

In some of embodiments, a photovoltaic material is wafer-based.

In some of embodiments, a photovoltaic material is tailored to emphasize absorption in a wavelength region emitted by the downshifting material.

In some of embodiments, the wavelength absorption range of a photovoltaic material is relaxed in wavelength regions that are not emitted by the downshifting material or in wavelength regions of poor absorbance of the photovoltaic material.

In some embodiments, the solar cell platform is modified to enhance collection or absorption of wavelength-specific photons within the downshifting material at the expense of absorption of the same wavelength-specific photons within the solar cell platform.

In some of embodiments, the production cost of the solar cell platform is favored over its light conversion efficiency.

In some of embodiments, the downshifting material includes a tunable nanomaterial.

In some embodiments, the nanomaterial is a quantum dot heterostructure (QDH).

In some embodiments, the quantum dot heterostructure is a multi-component nanocrystal which has been specifically tailored in size, chemical composition, and shape to be a downshifting material.

In some embodiments, the nanomaterial or quantum dot heterostructure has a non-spherical shell.

In some embodiments, the nanomaterial or quantum dot heterostructure is individually encapsulated.

In some embodiments, the downshifting material is solution-processable, i.e., the material is created in solution and can be applied as a liquid.

In some embodiments, the solution processed material is stabilized in a matrix and the matrix is deposited as a film.

In some embodiments, a solar cell employing a downshifting material is used as a low cost rooftop device.

In some embodiments, enhanced efficiency provided by the optical downshifting layer permits advantageous modifications to the solar cell platform that enhances its efficiency as well.

Additional aspects and advantages will be apparent from the following detailed description of preferred embodiments, which proceeds with reference to the accompanying drawings.

DETAILED DESCRIPTION OF PREFERRED EMBODIMENTS

Figure 1A:
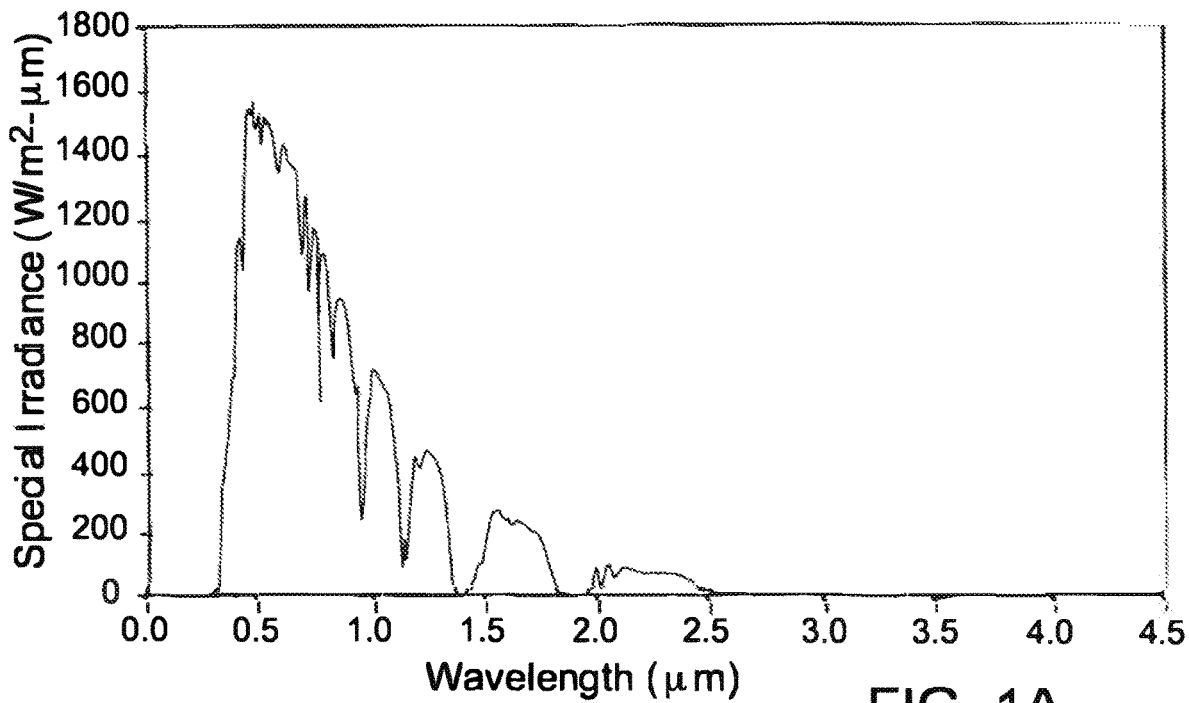
FIG. 1A is a graph showing the spectral irradiance versus wavelength.
Figure 1B:
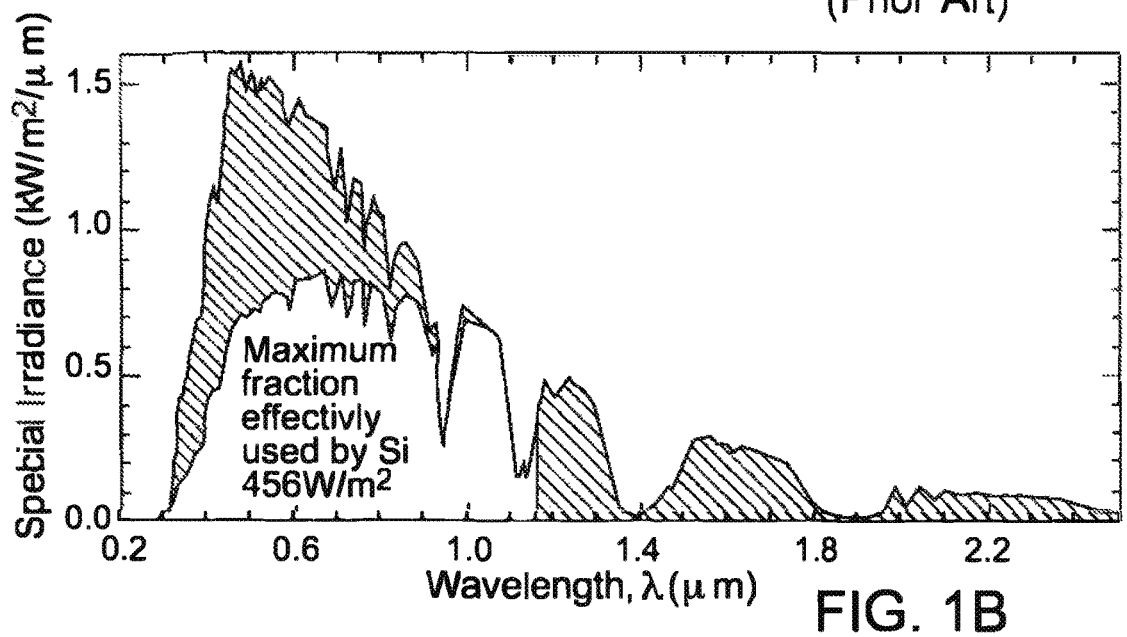
FIG. 1B is a graph showing the spectral irradiance generally available for collection and the fraction of the spectral irradiance effectively absorbed by silicon.

Within the fixed portion spectral irradiance from the Sun, silicon has a region of light conversion activity from about 0.3 micron to about 1.2 microns due to the 1.1 eV band gap of silicon for absorbing incident photons and generating electron and hole charge carriers, as shown in FIG. 1B. For silicon, this region is characterized at least in part by a primary light absorption spectrum from about 0.6 micron to about 1 micron, in which silicon effectively absorbs photons and generates electron and hole charge carriers. FIG. 1B shows, however, that silicon is far less effective at absorbing sunlight in about the 0.2 micron to almost 0.6 micron spectral region. Other photovoltaic materials exhibit areas of the spectral region that are less effective at absorbing sunlight than in their respective primary light absorption spectra.

For a typical solar cell platform using conventional photovoltaic material and having a limited primary light absorption spectrum, the efficiency of the solar cell platform can be increased by adding a spectral shifting layer. The spectral shifting layer shifts incident spectral radiation having wavelengths in a supplemental light absorption spectrum, which is substantially outside of the primary light absorption spectrum, to photons having wavelengths in the primary light absorption spectrum. The spectral shifting layer is also transmissive to incident photons having wavelengths in the primary light absorption spectrum and allows them to pass into the photovoltaic material so that the photovoltaic material can directly absorb these incident photons.

Figure 1C:
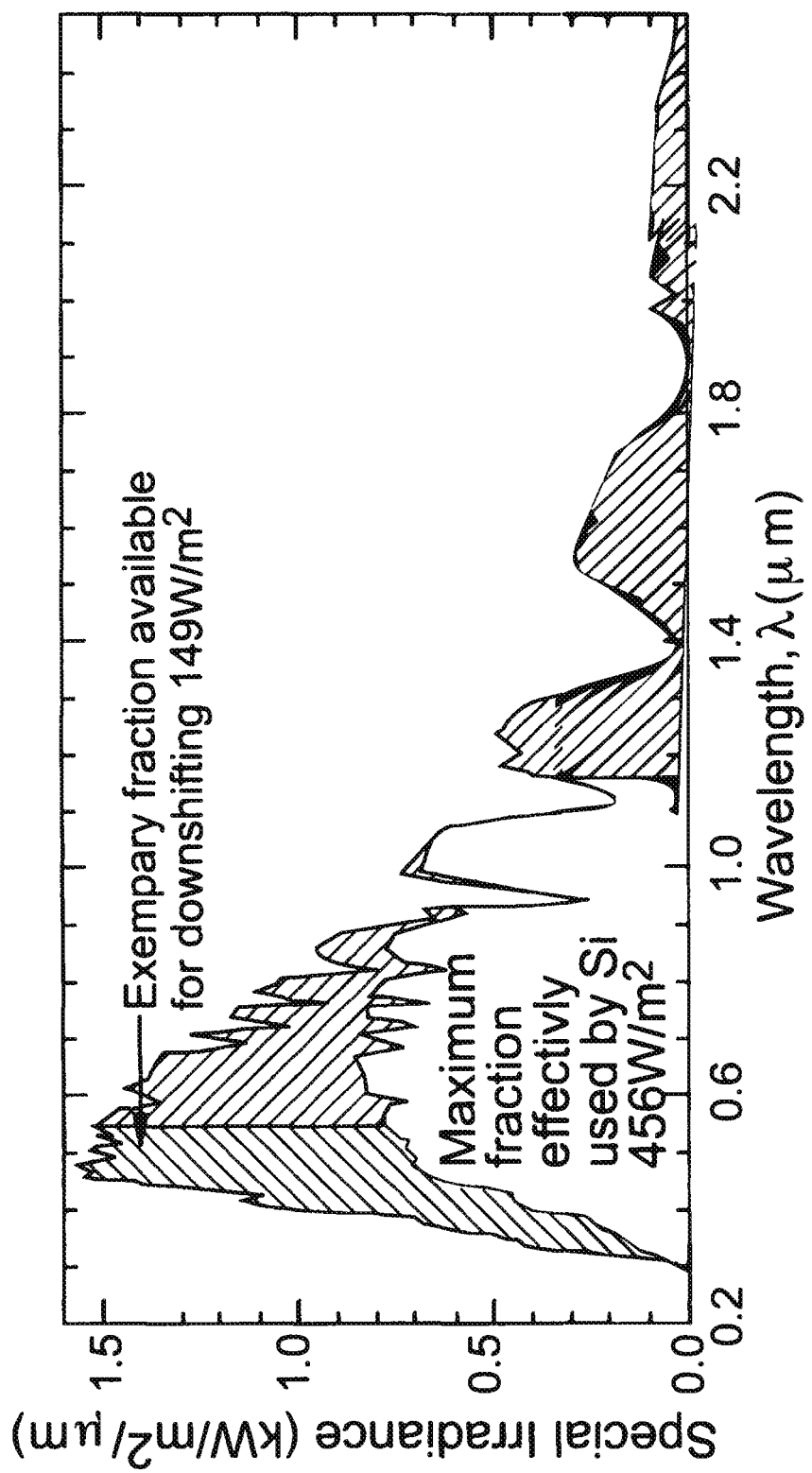
FIG. 1C is a graph showing the spectral irradiance generally available for collection, the fraction of the spectral irradiance effectively absorbed by silicon, and an exemplary fraction of the spectral irradiance that could be used for downshifting.

For example, in some embodiments, the spectral shifting layer is an optical downshifting layer that can absorb photons having higher band gap energies (shorter wavelengths) that are not readily absorbed by the photovoltaic material and emit photons having lower band gap energies (longer wavelengths) within primary light absorption spectrum that are readily absorbed by the photovoltaic material. Thus, a solar cell can be made to absorb the spectral irradiance more efficiently by employing such a spectral shifting layer in conjunction with the photovoltaic material. FIG. 1C is a graph showing the spectral irradiance generally available for collection, the fraction of the spectral irradiance effectively absorbed by silicon, and an exemplary fraction of the spectral irradiance that could be used by an optical downshifting layer.

Figure 2A:
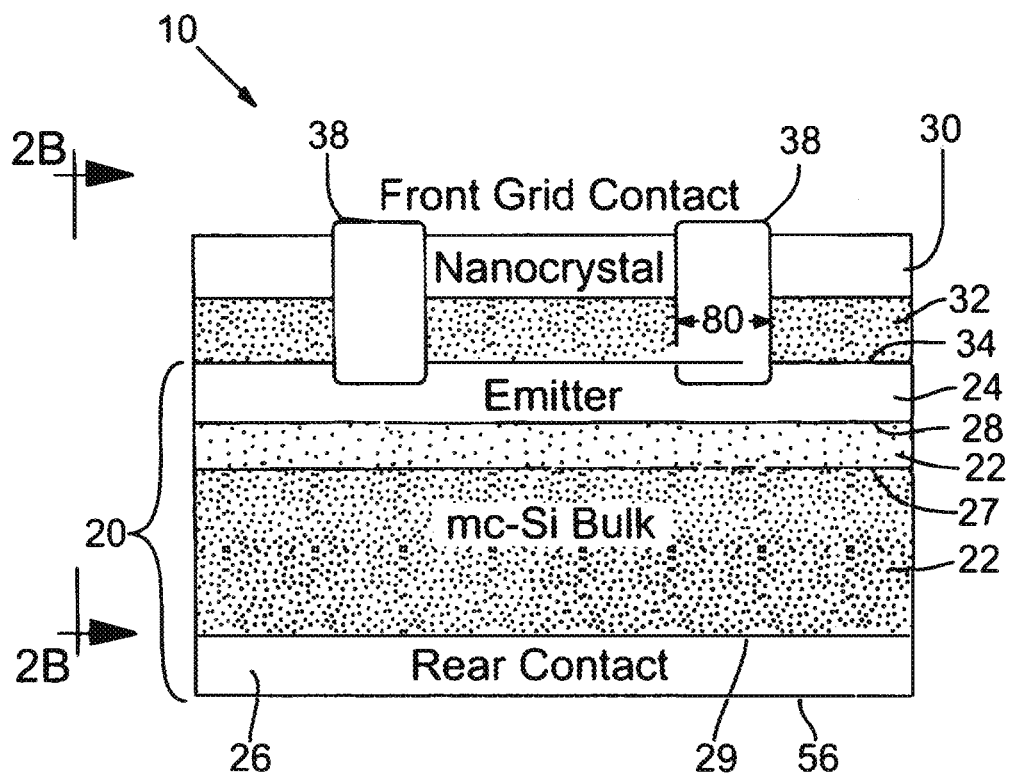
FIG. 2A is an enlarged simplified cross-sectional view of an exemplary solar cell including a photovoltaic material and an optical downshifting layer.

FIG. 2A is an enlarged simplified cross-sectional view of an exemplary solar cell 10 including a solar cell platform 20 having a photovoltaic material 22 positioned between an emitter electrode 24 and a rear contact electrode 26, which electrodes are spaced-apart from each other. (Emitter electrode 24 may also be referred to as top, upper, front, or sun-facing electrode 24, and rear contact electrode 26 may also be referred to as bottom, lower, back, or earth-facing electrode 26.) Photovoltaic material 22 includes at least one charge-separating junction 27 where differently doped regions of bulk photovoltaic material 22 meet. Although p-n type charge-separating junctions 27 are most common, n-p type, p-i-n type, and other type junctions may be employed. Skilled persons will also appreciate that even though charge-separating junction 27 is shown as a line (with a planar interface texture and no volume), charge-separating junction 27 may have a nonplanar interface texture and may include a volume (including a height) of bulk material due to doping gradients. In some embodiments, photovoltaic material 22 and emitter and rear contact electrodes 24 and 26 form respective charge-separating junction interfaces 28 and 29 for separating the electron and hole charge carriers for collection by emitter electrode 24 and rear contact electrode 26.

With reference to FIG. 2A, emitter electrode 24 directly or indirectly supports an optical downshifting layer 30. In some embodiments, optical downshifting layer 30 is deposited directly on a textured external surface 34 of emitter electrode 24. In some embodiments, one or more supplemental layers 32, such as an anti-reflective coating (ARC), may be positioned on or applied to external surface 34 of emitter electrode 24 between emitter electrode 24 and optical downshifting layer 30. Front grid contacts 38 may extend from emitter electrode 24 through supplemental layers 32 and optical downshifting layer 30 to convey electrical current from emitter electrode 24 to the surface of solar cell 10.

Figure 2B:
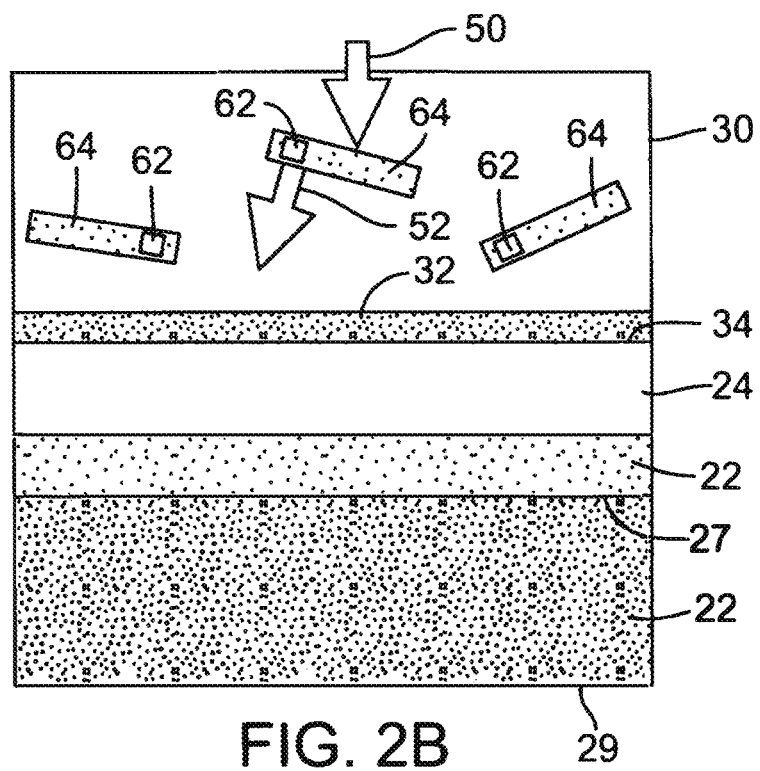
FIG. 2B is an enlarged portion of the cross-sectional view of FIG. 2A showing absorption and emission occurring in the optical downshifting layer.

FIG. 2B is an enlarged portion of the cross-sectional view of FIG. 2A, showing absorption and emission occurring in optical downshifting layer 30.

The components of optical downshifting layer 30 are not drawn to scale. In particular, optical downshifting layer 30 absorbs a photon 50 having a wavelength in the supplemental light absorption spectrum of photovoltaic material 22 and emits a photon 52 having a wavelength in the primary light absorption spectrum of photovoltaic material 22.

Photovoltaic material 22 can be any material that actively absorbs light and converts it to electricity. For example, photovoltaic material 22 can be any conventional photovoltaic material such as a first, second, or third generation photovoltaic material. Exemplary photovoltaic materials 22 include, but are not limited to, crystalline silicon (c-Si) or multicrystalline silicon (mc-Si); nanocrystalline silicon; amorphous silicon (a-Si); micromorphous silicon; gallium arsenide (GaAs); InP; InAs; combinations of GaAs, InP, or InAs; other III-V-based photovoltaic materials; cadmium telluride (CdTe), copper indium selenide (CIS), copper indium gallium di-selenide (CIGS), active organic photovoltaic materials, dye-sensitized solar cell (DSC) materials, and active quantum dot (QD) ensembles. Quantum dot ensembles are disclosed in detail in U.S. patent application Ser. No. 12/606,908, entitled Solar Cell Constructed with Inorganic Quantum Dots and Structured Molecular Contacts, which is herein incorporated by reference. In some embodiments, photovoltaic material 22 forms a wafer-based solar cell platform 20.

In some embodiments, any photovoltaic material 22 having limited spectral activity in the blue wavelength region could be employed. In some embodiments, silicon-based photovoltaic materials 22 have a primary light absorption spectrum from about 0.6 micron to about 1 micron. In some embodiments, CdTe-based photovoltaic materials 22 have a primary light absorption spectrum from about 500 nm to about 900 nm.

In terms of efficiency, a photovoltaic material 22 preferably has a light conversion efficient of at least 10%. In some embodiments, a lower light conversion efficiency may be adequate if the production costs are low. In some embodiments, a moderately or highly efficient photovoltaic material 22 is preferred, especially in area-constrained applications. In particular, some preferred photovoltaic materials 22 have light conversion efficiency of greater than 15%.

In some embodiments, photovoltaic material 22 is selected based on low production costs. In many embodiments, photovoltaic material 22 is selected based on the lowest production cost for the highest efficiency. In many embodiments, other selection factors, such as longevity and reliability, as well as primary absorption spectrum, are also or alternatively considered for choosing a suitable photovoltaic material 22. For example, a typical solar cell module based on silicon-containing solar cell platforms has a 25-year warranty. Thus, desirable longevity for photovoltaic material 22 may be even longer.

Because the effect of downshifting layer 30 is additive, the light conversion efficiency of photovoltaic material 22 is not critical. Although practical optimized light—conversion efficiency is preferred, even a photovoltaic material 22 with non-optimal light conversion efficiency can be used as a platform. Such platforms with suboptimal efficiency may be intentionally selected by design or not. For example, a solar cell platform 20 having a photovoltaic material 22 generated in a screen-printed process can be used because the blue part of the spectrum, where a screen-printed solar cell platform 20 is most inefficient, will be downshifted by downshifting layer 30.

In some embodiments, optical downshifting layer 30 has a sharp, tunable absorption onset at a wavelength where the external quantum efficiency (EQE) of photovoltaic material 22 begins to drop. In some embodiments, the supplemental light absorption spectrum is substantially outside of the primary light absorption spectrum of the active solar device so as to avoid reduction of light conversion activity of the photovoltaic material in the primary light absorption spectrum of the active solar device. In some embodiments, the majority of the supplemental light absorption spectrum is outside of the primary light absorption spectrum. In some embodiments, the supplemental light absorption spectrum is entirely outside of the primary light absorption spectrum.

In some embodiments, the onset absorption wavelength falls between 500 nm and 600 nm. Thus, in some examples, the supplemental light absorption spectrum of optical downshifting layer 30 may include wavelengths shorter than or equal to 600 nm. In some embodiments, the tunable absorption spectrum ranges downward to include the lower range of significant spectral irradiance. In some embodiments, the tunable absorption spectra ranges downward to include wavelengths of 300 nm or shorter. In some examples, the supplemental light absorption spectrum of optical downshifting layer 30 may include wavelengths longer than or equal to 200 nm.

In some embodiments, optical downshifting layer 30 has an emission spectrum that is separated from the supplemental light absorption spectrum such that the emitted light is not reabsorbed in optical downshifting layer 30. In some embodiments, the emission spectrum is separated from the supplemental light absorption spectrum by greater than 50 nm or by an energy gap of greater than 0.5 eV. In some embodiments, optical downshifting layer 30 has an independently tunable emission spectrum. In some embodiments, optical downshifting layer 30 has an emission spectrum that emits photons having a wavelength greater than 600 nm. In some embodiments, optical downshifting layer 30 has an emission efficiency of greater than 90%. In some embodiments, optical downshifting layer 30 is simple and inexpensive to lay down on top of the solar cell platform 20, using a quick, solution-based process at ambient pressure.

In some embodiments, optical downshifting layer 30 includes one or more nanomaterials to efficiently absorb in the supplemental light absorption spectrum and emit photons in the primary light absorption spectrum of a given photovoltaic material 22, i.e., the nanomaterial forming optical downshifting layer 30 absorbs photons where the spectral absorbance of photovoltaic material 22 is low and reemits photons at a wavelength where the spectral absorbance of photovoltaic material 22 is high.

Nanomaterials are materials with at least one nano-scale dimension, are often grown colloidally, and have been made in the form of dots, rods, tetrapods, and even more exotic structures. (See Scher, E. C.; Manna, L.; Alivisatos, A. P. *Philosophical Transactions of the Royal Society of London.*

Series A: Mathematical, Physical and Engineering Sciences 2003, 361, 241 and Manna, L.; Milliron, D. J.; Meisel, A.; Scher, E. C.; Alivisatos, A. P. *Nat Mater* 2003, 2, 382-385.) Their sizes generally range from 3 nm to 500 nm. Due to the quantum size effects which arise from a material having dimensions on the order their electron's bohr radius, the band gap of the material can also be tuned (See Alivisatos, A. P. *J. Phys. Chem.* 1996, 100, 13226-13239 and Bawendi, M. G.; Steigerwald, M. L.; Brus, L. E. *Annual Review of Physical Chemistry* 1990, 41, 477-496.) In addition to facilitating tunability of the band gap for absorption and emission, the nanomaterials often have near perfect crystallinity, allowing them to attain extremely high photoluminescence (See Talapin, D. V.; Nelson, J. H.; Shevchenko, E. V.; Aloni, S.; Sadtler, B.; Alivisatos, A. P. *Nano Lett.* 2007, 7, 2951-2959 and Xie, R.; Battaglia, D.; Peng, X. *J. Am. Chem. Soc.* 2007, 129, 15432-15433.)

The nanomaterials can be suspended in an inert polymer matrix material that could also be used as the encapsulating material for solar cell platform 20. Nanomaterials are highly suitable for use as optical downshifting layer 30 and offer serious advantages over dyes. The nanomaterials are solution processable, highly controllable semiconductor nanostructures synthesized by low-cost solution-based methods and can be made to have the exact optical properties desired for optical downshifting layer 30. Because of their unique structure and composition, nanomaterials can be more stable than dyes.

Semiconductor nanocrystals have unique physical and electronic properties due to their quantum confinement. Because of their high surface area to volume ratios, the optical and electrical properties of semiconductor nanocrystals are highly governed by their surface defects. In a homogeneous dispersion of nanocrystals in a matrix, there is a strong nanocrystal-nanocrystal interaction induced by the hydrophobicity of the organic ligand, possibly leading to aggregation.

Figure 3:
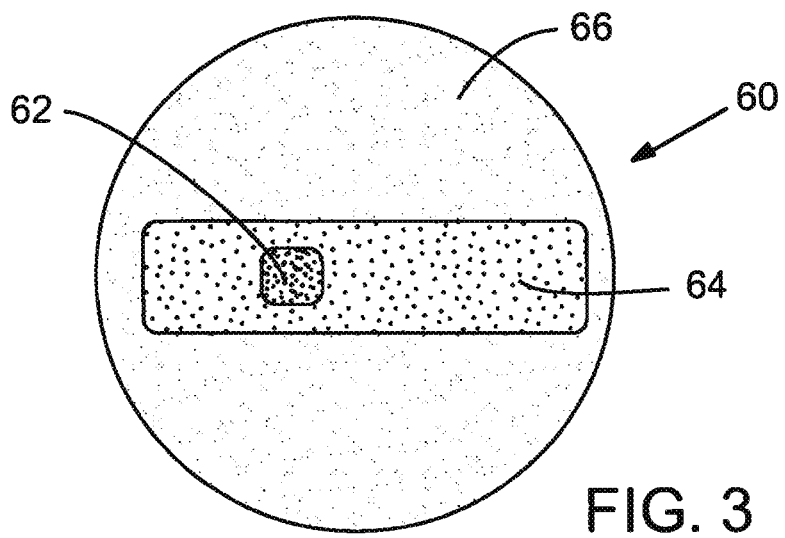
FIG. 3 is simplified enlarged drawing of an encapsulated nanomaterial, such as a quantum dot heterostructure.

In some embodiments, optical downshifting layer 30 includes nanomaterials, particularly quantum dot heterostructures (QDHs), encapsulated discretely by secondary materials through a micelle approach. FIG. 3 is simplified enlarged drawing of an encapsulated quantum dot heterostructure 60. With reference to FIG. 3, encapsulated quantum dot heterostructure 60 includes a quantum dot heterostructure having a core 62 surrounded by one or more shells 64. Shell 64 is further encapsulated by an encapsulating material 66, such as a silica sphere.

By discretely encapsulating each semiconductor nanocrystal, it is possible to homogeneously disperse the nanocrystals in a matrix media, as well as protect the nanocrystal surface from the external environment. Therefore, the introduction of the encapsulating materials 66 greatly helps to both passivate nanocrystal surface defects and isolate the individual nanocrystals for better dispersion. Thus, the encapsulating materials 66 minimize the interaction among the nanocrystals, improving the stability as well as the homogeneity in a matrix media.

For such optical downshifting materials 30, outer encapsulating materials 66 can be grown on individual nanocrystals non-epitaxially. Micelles are formed using a pair of polar and non-polar solvents in the presence of a compatible surfactant. The surface polarity of a nanocrystal can be modified so that only a single nanocrystal will reside in an individual micelle. Subsequently, an inorganic or organic encapsulating material 66 may be selectively grown inside of the micelle, which acts as a spherical template. By adding additional precursors, an inorganic or polymeric encapsulating material 66 can be further grown on the nanocrystal. (See Selvan, S. T.; Tan, T. T.; Ying, J. Y. *Adv. Mater.,* 2005, 17, 1620-1625; Zhelev, Z.; Ohba, H.; Bakalova, R. *J. Am. Chem. Soc.,* 2006, 128, 6324-6325; and Qian, L.; Bera, D.; Tseng, T.-K.; Holloway, P. H. *AppL Phys. Lett.,* 2009, 94, 073112.)

Figure 3D:
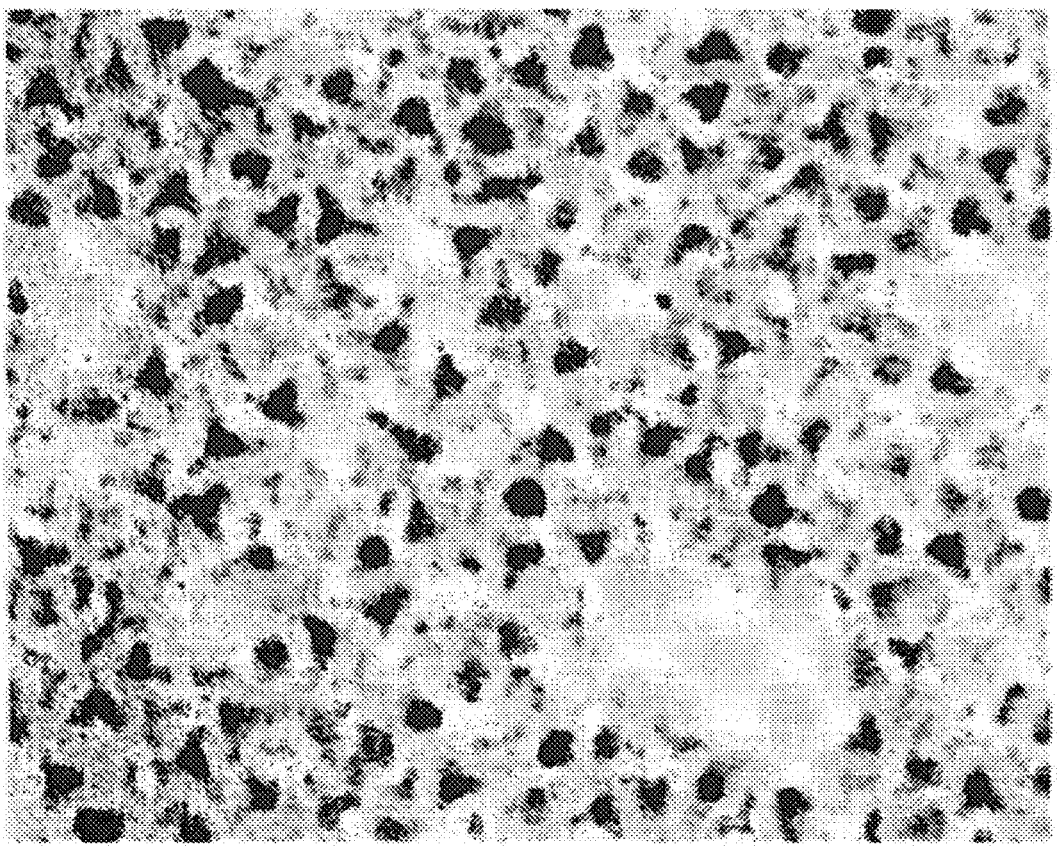
FIG. 3D is a TEM image of an exemplary manganese-doped ZnSe quantum dots.
Figure 3A:
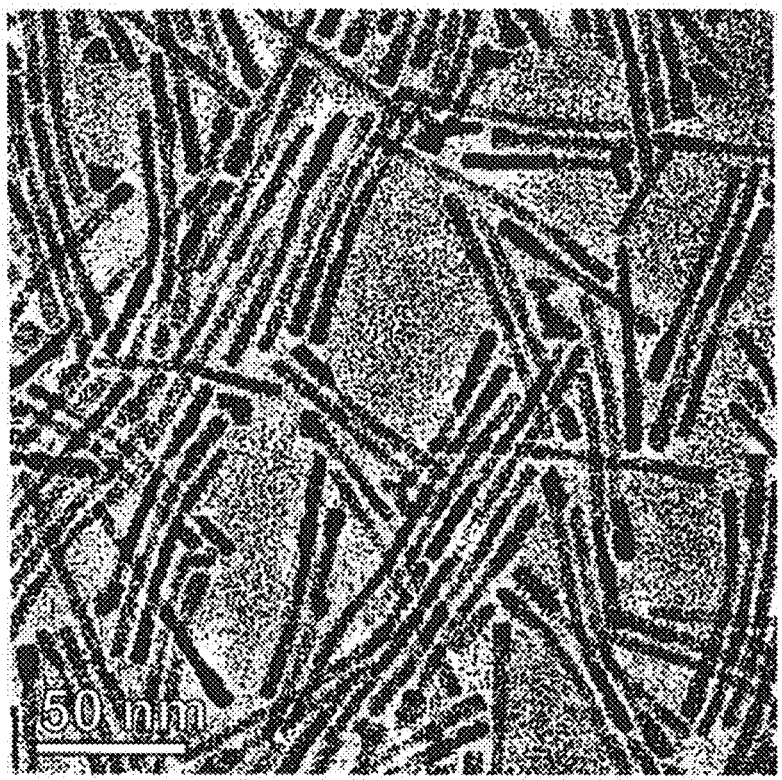
FIG. 3A is a TEM image of an exemplary CdSe/CdS quantum dot heterostructure.
Figure 3B:
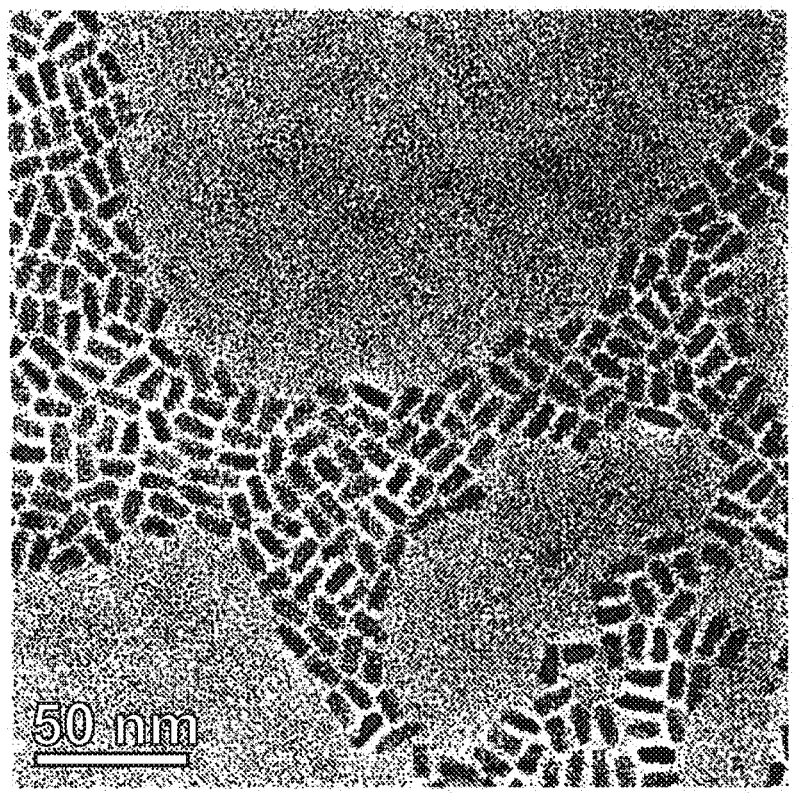
FIG. 3B is a TEM image of an exemplary CdSe/CdS quantum dot heterostructure grown to a different aspect ratio than that of FIG. 3A.
Figure 3C:
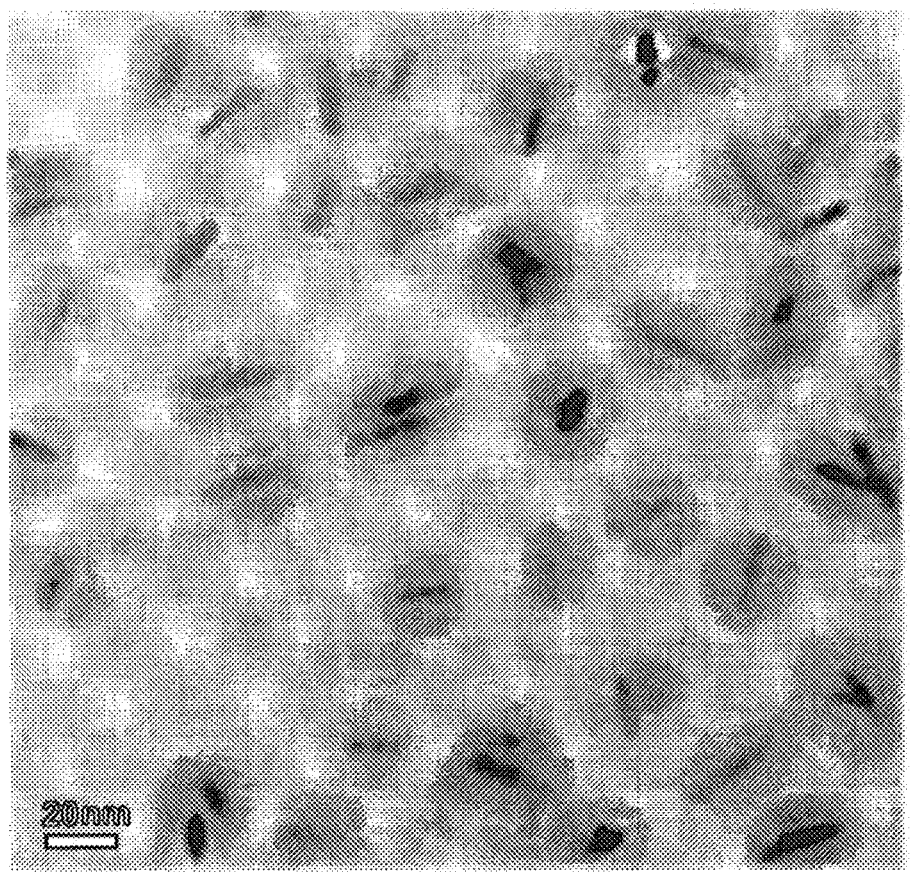
FIG. 3C is a TEM image of exemplary encapsulated quantum dot heterostructures: CdSe dot cores having rod-shaped CdS shells individually encapsulated in a silica encapsulating material.

Thus, by tuning the synthetic conditions, a single nanocrystal can be incorporated in a silica sphere as shown in FIG. 3 (and FIG. 3C). Throughout the encapsulation process, the nanocrystal surfaces are well passivated to avoid aggregation. Additionally, this passivation endows the nanocrystals with photoluminescence quantum yields of and near unity. For encapsulated nanocrystals, the matrix compatibility can be dependent on the surface of the encapsulating sphere, not the nanocrystal. Since the surface of the encapsulating material 66 is spatially removed from the nanocrystal surface, alterations to the exterior of the encapsulating material 66 do not adversely affect the electronic or optical properties of the nanocrystal.

Semiconductor nanocrystals, such as cadmium selenide or indium phosphide, have widely been studied for control over both their composition and shape. (See Scher, E. C.; Manna, L.; Alivisatos, A. P. *Philosophical Transactions of the Royal Society of London. Series A: Mathematical, Physical and Engineering Sciences* 2003, 361, 241 and Talapin, D. V.; Rogach, A. L.; Shevchenko, E. V.; Kornowski, A.; Haase, M.; Weller, H. *J. Am. Chem. Soc* 2002, 124, 5782-5790.)

Thus, in addition to spherically-shaped nanostructures, various non-spherical nanostructures have been demonstrated including, but not limited to, nanorods, nanotetrapods, and nanosheets. Non-spherical semiconductor nanocrystals have different physical and electronic properties from those of spherical semiconductor nanocrystals. These properties can be employed advantageously in downshifting optical layer 30.

In some embodiments, the nanomaterials are quantum dot heterostructures. A quantum dot heterostructure is a nanomaterial which has been specifically engineered, including but not limited to, tailoring in size, chemical composition, shape, optical, and/or electrical properties, to perform a particular function. In particular, the quantum dot heterostructures can be multi-component nanocrystals tailored for downshifting applications.

In some embodiments, optical downshifting material 30 may include individually encapsulated nanomaterials, particularly quantum dot heterostructures, employing one type of core material, one type (composition) of shell material, and one shape of shell material. In some embodiments, optical downshifting material 30 may include individually encapsulated quantum dot heterostructures, particularly quantum dot heterostructures, employing two or more varieties of individually encapsulated quantum dot heterostructures, such as a first type of individually encapsulated quantum dot heterostructure, employing a first type of core material, a first type of shell material, and a first shape of shell material and a second type of individually encapsulated quantum dot heterostructure, employing the first type of core material, the first type of shell material, and at least one or more different shapes of shell material, such as rods and tetrapods.

In some embodiments, the second type of individually encapsulated quantum dot heterostructure employs a first type of core material, at least one or more different types of shell material, such as ZnS or CdS, and the first or at least one or more different shapes of shell materials. In such embodiments, each shell material may be associated with a specific shape, or each shell material may be formed with a plurality of shapes. In some embodiments, the second type individually encapsulated quantum dot heterostructures employs at least one or more different types of core materials, the first or one or more different types of shell materials, and the first or one or more different types of shell shapes. In such embodiments, each core material may be associated with specific shell materials and/or shapes, or each core material may be associated with one or more shell materials and/or shapes.

As described above, some advantages of employing a quantum dot heterostructure as an optical downshifting layer 30 include an increased solar cell efficiency in the blue part of the solar spectrum, where typical photovoltaic materials 22 have a low quantum efficiency. The QDH optical downshifting layer 30 also provides a decreased thermal load in the solar cell platform 20 because the blue photons are absorbed above and never reach photovoltaic material 22, where most of them would be converted to heat inside solar cell platform 20.

In one example, the onset of absorption and separation between absorption and emission peaks can be tuned by 0.5 eV or more, enabling long wavelength light to pass through unhindered to solar cell platform 20 beneath and minimizing re-absorption within optical downshifting layer 30. Pradhan, N., Peng, X., "Efficient and Color-Tunable Mn-Doped ZnSe Nanocrystal emitters: Control of Optical Performance via Greener Synthetic Chemistry," *J. Am. Chem. Soc.*, 129 (11), Pgs. 3339-3347 (2007); Talapin, D. V., Nelson, J. H., Shevchenko, E. V., Aloni, S., Sadtler, B., Alivisatos, A. P., "Seeded Growth of Highly Luminescent CdSe/CdS Nanoheterostructures with Rod and Tetrapod Morphologies," *Nanoletters* v. 7, no. 10 Pgs. 2951-2959 (2007); and Sholin, V., Olson, J. D., Carter, S. A. "Semiconducting polymers and quantum dots in luminescent solar concentrators for solar energy harvesting," *Journal of Applied Physics*, v. 101, no. 12, Pg. 123114 (2007) describe methods for tuning nanomaterials.

In some embodiments, the quantum dot heterostructures can include following inorganic compounds and/or any combination of alloys between them: CdSe, CdS, CdTe, ZnSe, ZnS, ZnTe, CuS2, CuSe2, In2S3, In2Se3, CuGaSe2, CuGaS2, CuInS2, CuInSe2, PbSe, PbS, SiO2, TiO2, ZnO, ZrO. These materials can be arranged in cores 62, core-shells, and core-shell-shells, with or without organic ligands, such as phosphonic acids, carboxylic acids, amines.

In some examples, quantum dot heterostructures including CdSe, CdSe/ZnS, CdSe/CdS, or CdTe have provided very high luminescence. Quantum dot heterostructures based on the II-VI chalcogenides are very well understood as high efficiency emitters. In solution, the quantum dot heterostructures particles have quantum efficiencies as high as 95%. The quantum dot heterostructure materials may be distributed in matrices of polydimethylsiloxane, polyvinylbutyral, or ethylvinylacetate, for example, and may be incorporated into the encapsulating material and cover both emitter electrode 24 and rear contact electrode 26.

FIG. 3A is a transmission electron microscopy (TEM) image of an exemplary CdSe/CdS quantum dot heterostructure. FIG. 3B is a TEM image of an exemplary CdSe/CdS quantum dot heterostructure grown at a temperature lower than that of FIG. 3A. In some embodiments, the core 62, such as a CdSe core 62 may have no physical dimension greater than 6 nm, while the extended shell 64, such as a CdS extended shell 64, has at least one dimension greater than 15 nm and another dimension that is about 1-2 nm thicker than the CdSe core 62. Thus, the thickness of the shell 64 may be as thin as 1 or 2 nm along some axes and may be greater than 9 nm along other axes. The casing of the oxide encapsulating material 66 can range between 1 and 50 nm in radius.

In some embodiments, quantum dot heterostructure materials of optical downshifting layer 30 exhibit a tunable onset of absorption at a wavelength of around 600 nm, with a range of approximately 50 nm. In all cases, the absorption rapidly increases moving to the ultraviolet. The gap between absorption onset and peak emission in the quantum dot heterostructure materials of optical downshifting layer 30 may also be tuned between 50 nm to 200 nm in separation.

In some embodiments, quantum dot heterostructure materials of optical downshifting layer 30 exhibit supplemental light absorption ranges having supplemental light absorption spectrum with a maximum absorption wavelength at about 600 nm and a minimum absorption wavelength in the ultraviolet. In some embodiments, the supplemental light absorption spectrum of the QDH materials covers a range of at least 250 nm. In some embodiments, the range of the supplemental light absorption spectrum may be shorter, and the maximum absorption wavelength may also be shorter to provide for a gap between absorption and emission in the QDH materials of optical downshifting layer 30. In some embodiments, the minimum emission wavelength is about 50 to 200 nm longer than the maximum absorption wavelength.

In one example, optical downshifting layer 30 having quantum dot heterostructure material absorbs photons at a maximum absorption wavelength of about 480 nm and emits photons at a minimum emission wavelength of about a 620 nm wavelength. In some embodiments, the emission will be slightly shifted more into to the red spectrum. For example, using a CdTe core material instead of CdSe provides red shifted emission.

In some examples, optical downshifting layers 30, including a quantum dot heterostructure of CdSe quantum dots with a graded shell of CdS that transitions into ZnS, have maximum absorption wavelengths between about 500 and 700 nm and have supplemental light absorption spectrums extending to shorter wavelengths. In some embodiments, the minimum emission wavelength is about 50 to 100 nm longer than the maximum absorption wavelength. In one example, optical downshifting layer 30, having a CdSe-based quantum dot heterostructure material, has a maximum absorption wavelength of about 450 nm and a minimum emission wavelength of about 550 nm, with a re-emission efficiency of greater than 80%.

In some examples, optical downshifting layer 30 includes quantum dot heterostructures of CdSe quantum dots with a rod-shaped CdS shell 64, encapsulated in a silica encapsulating material 66. This quantum dot heterostructure material exhibits maximum absorption at wavelengths shorter than 500 nm and maximum emission at wavelengths between 550-700 nm. The silica shell serves the dual purpose of enhancing the passivation of the nanocrystals for increased photoluminescence re-emission efficiency, while also preventing nanocrystal aggregation and increasing the dispersability of the nanocrystal in the downshifting layer matrix. FIG. 3C is a TEM image of exemplary quantum dot heterostructures of CdSe quantum dot cores 62 having rod-shaped CdS shells 64 individually encapsulated in a silica encapsulating material 66.

In some embodiments, optical downshifting layer 30 includes CdSe quantum dots with a rod-shaped CdS shell 64, which is further covered by a second shell 64 of ZnSe, which is encapsulated in a silica encapsulating material 66.

Non-Cd based quantum dots can also be employed. In one example, doped ZnSe has been used in matrices of polydimethylsiloxane, polyvinylbutyral, or ethylvinylacetate. In some examples, the ZnSe is doped with manganese. FIG. 3D is a TEM image of an exemplary is manganese-doped ZnSe quantum dot heterostructure.

In some examples, ZnSe quantum dots have a maximum absorption wavelength between 350 and 450 nm. The minimum emission wavelengths largely depend on the nature of the particular structures but range from a shift of about 100 to 200 nm longer than the maximum absorption wavelength. In some examples, InP quantum dot heterostructure materials have a maximum absorption wavelength ranging from 500 to 750 nm, with minimum emission wavelengths that are longer.

Figure 4:
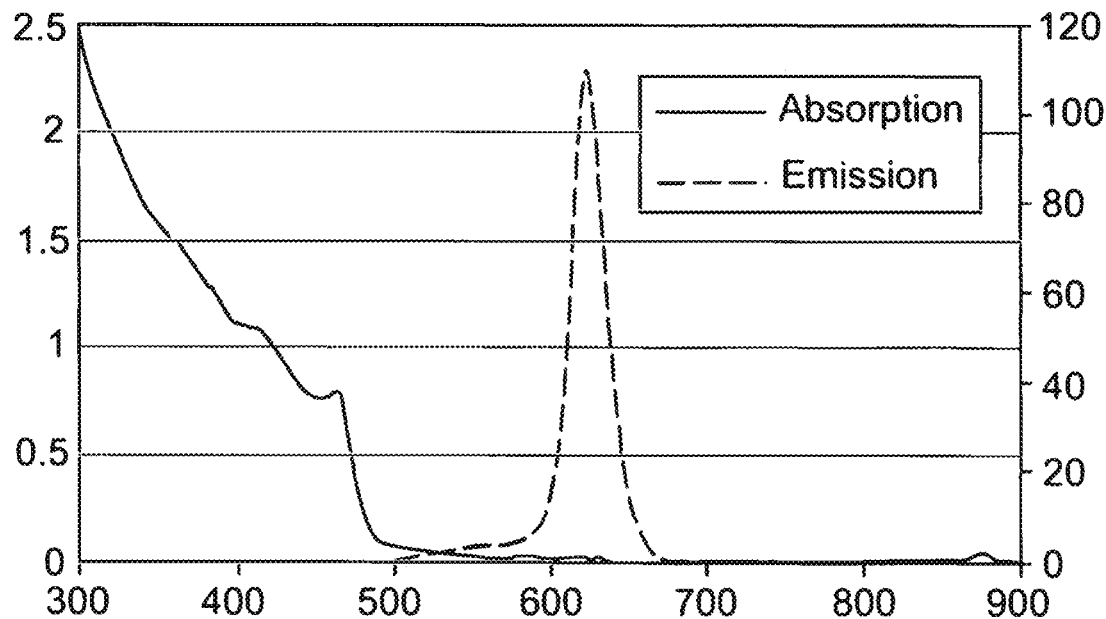
FIG. 4 is a graph of absorption and emission versus wavelength, showing absorption and emission by exemplary quantum dot heterostructures.

FIG. 4 is a graph of absorption and emission versus wavelength, showing exemplary quantum dot heterostructure activity with absorption in a solid line and emission in a dashed line. Skilled persons will appreciate that the concept of employing quantum dot heterostructures for use as downshifting layer 30 is not dependent on the specific morphology of the solar cells platforms 20 or its junctions. The labeling on the left of the graph shows relative absorbance, and the labeling on the right of the graph shows relative photoluminescence.

Figure 5:
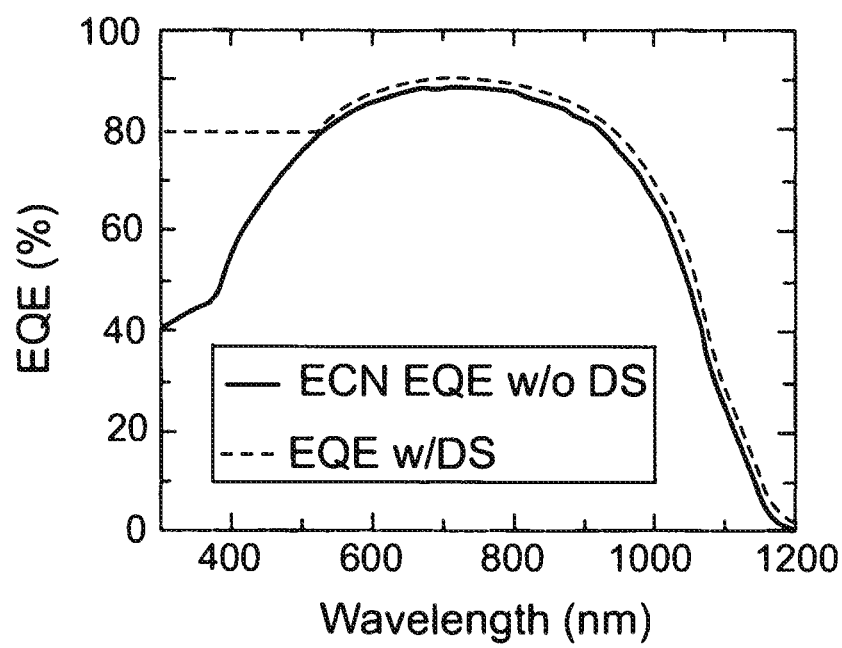
FIG. 5 is a graph of exemplary external quantum efficiency (EQE) of a silicon solar cell versus wavelength, showing the EQE differences between solar cells with and without an optical downshifting layer.

To illustrate the expected efficiency increase due to downshifting, the losses associated with downshifting have been calculated to determine that a maximum EQE of about 80% is achievable in the absorbing window of optical downshifting layer 30. Light emitted within the escape cone of optical downshifting layer 30 is primarily responsible for the 80% limit FIG. 5 is a graph of exemplary EQE versus wavelength, showing the EQE differences between a solar cell with and without optical downshifting layer 30. The thick line shows the typical EQE response of a multicrystalline solar cell platform 20 (made at ECN in the Netherlands) in the absence of optical downshifting layer 30, and the thin line shows the EQE in the presence of optical downshifting layer 30.

In one embodiment, an optimal design will choose an optical downshifting layer 30 with an absorption onset (maximum absorption wavelength) at the wavelength the EQE of photovoltaic material 22 drops below 80%. In one example, the photovoltaic material 22 is multicrystalline silicon. Consequently, the EQE would be 80% or higher at the low end of the primary light absorption spectrum of multicrystalline silicon. The example shown in FIG. 5 presents an increased conversion efficiency of about 0.5% absolute, due solely to the downshifting effect.

While a 0.5% increase in conversion efficiency may appear to be a minimal improvement, incorporation of optical downshifting layer 30 allows the design rules for solar cell platform 20 and its photovoltaic material 22 to be relaxed, such as by decoupling the short wavelength response from the long wavelength response.

Skilled persons will appreciate that the use of a blue-absorbing optical downshifting layer 30 will work advantageously with a cell technology whose external quantum efficiency drops sharply in the blue. Traditionally, solar cell platforms 20 based on silicon photovoltaic materials 22 have been optimized to have a spectral response over the widest possible wavelength range at the expense of wavelength specific response. So, by attempting to capture some blue light with these conventional photovoltaic materials 22 or conventional solar cell platforms 20, the resulting conventional solar cell platforms 20 have diminished capacity in red regions of their spectral response.

By employing an optical downshifting layer 30 that performs best at short wavelengths, a solar cell designer can tailor the solar cell platform 20 or its photovoltaic material 22 to increase the response in certain visible and near infrared (NIR) wavelengths at the expense of its performance in the blue.

In some embodiments, the structure of multicrystalline silicon in solar cell platform 20 can be modified in order to optimally pair it with a blue-absorbing optical downshifting layer 30.

In some embodiments, at least a 1-2% absolute gain in light conversion efficiency is possible with small modifications, such as lowering the resistance of the emitter electrode 24 to the front grid contact 38, and such as tuning the optics of solar cell platform 20 to respond better to longer wavelength light. Therefore, an optimally integrated solar cell 10 having a blue-absorbing optical downshifting layer 30 and a modified photovoltaic material 22 (or its environment) can have a light conversion efficiency increase of greater than 1% absolute. This increase can be accomplished at an additive cost of 8-10 cents for each wafer, for example. The concurrent increase in efficiency and power output would, however, lower the overall cost per watt of a standard multicrystalline silicon solar cell 20, for example, by roughly 40 cents per watt.

In some embodiments, external surface 34 of emitter electrode 24 of solar cell platform 20 is modified to increase the light conversion efficiency in the primary absorbance spectrum. In some examples, the doping level (such as total amount of dopant) of emitter electrode 24 is modified (typically increased) to reduce series resistance. In some examples, the emitter electrode 24 can possess a sheet resistance of order 5-30 Ohms/square (such as a surface doping concentration of greater than $1e^{20}/cm^3$ and an emitter thickness ranging from 1.0-0.5 µm), representing a drastic reduction from the level of 65-110 Ohms/square (such as a surface doping concentration of $1-2e^{20}/cm^3$ to about $5e^{19}/cm^3$ and an emitter thickness ranging from 0.4-0.2 µm) for conventional solar cells that do not have an optical downshifting layer 30. For example, higher phosphorous surface concentration results in a lower specific contact resistance for a tunneling based carrier transport mechanism. A thicker 5-30 ohms/sq emitter would not only lead to reduced solar cell shunting issues and hence a higher yield but also provide a wider solar cell process window. It is also noted that dopant density at the emitter surface decreases toward the p-n junction. For example, a phosphorus density of about $2e^{20}/cm^3$ at the emitter surface decreases to about $1e^{17}/cm^3$ at the p-n junction.

In some examples, the increased doping level emitter electrode 24 may reduce the blue response of solar cell platform 20 because a more highly doped emitter electrode 24 may become less transmissive to blue photons. However, the blue photons, which are absorbed by optical downshifting layer 30 at a much greater efficiency than they can be absorbed by photovoltaic material 22, are downshifted into the primary absorbance spectrum. The downshifted photons are not significantly adversely affected by the increased doping emitter electrode 24 and make their way into photovoltaic material 22, where they are readily absorbed and converted in holes and carriers that are captured by emitter electrode 24 (and/or rear contact electrode 26). In some examples, a gas or liquid mixture containing phosphorous can be used to dope p-type Si and convert it to n-type emitter electrode 24. Conventional thicknesses of the emitter electrode are 200-400 nm, but in embodiments employing optical downshifting layer 30, the emitter electrode 24 can be as little as 200-400 nm, but also thicker than 400 nm and as thick as 1 micron. In particular, higher doping can easily yield specific contact resistance values that are less than 3 mohm-cm2 to achieve good fill factors.

Skilled persons will appreciate that doping and other parameters of rear contact electrode 26 may also be modified.

In some embodiments, the doping level of emitter electrode 24 is modified (typically increased) and the gap between front grid contacts 38 is increased, thereby decreasing the fractional shading of the underlying layers. The increased doping level of emitter electrode 24 compensates for increased resistivity incurred by the increased gap between front grid contacts 38, so the overall resistance of the solar cell platform 20 is about the same (or not significantly adversely affected). However, the increased gap between front grid contacts 38 reduces shading of photovoltaic material 22 so that more of it is exposed to ambient light, thereby increasing the capture efficiency of photons incident on solar cell 10. For example, the spacing between grid contacts 38 can be increased from roughly 2 mm to greater than 3 mm. This increased gap has the effect of decreasing the number of grid contacts 38 needed and thereby decreasing the grid electrode shading percentage from greater than 6% to less than 5%. Although the increased doping of emitter electrode 24 decreases the response of the solar cell platform 20 to blue wavelengths, for example, optical downshifting layer 30 more than adequately compensates for the loss, as previously explained.

The width 80 of front grid contacts 38 can additionally or alternatively be reduced to reduce the shading of photovoltaic material 22 so that more of it is exposed to ambient light, thereby increasing the capture efficiency of photons incident on solar cell 10. The increased doping level of emitter electrode 24 can compensate for increased resistivity incurred by the decreased cross-sectional area of front grid contacts 38, so the overall resistance of the solar cell platform 20 is about the same (or not significantly adversely affected).

In some embodiments, other aspects of front grid contacts 38 are changed, such as configuration, spacing, height, or other features, to optimize contact resistance. For example, the height of front grid contacts 38 can be reduced to decrease shading of photovoltaic material 22 by offsetting the decreased resistivity with increased doping of emitter electrode 24, such as previously described.

With reference again to FIGS. 2A and 2B, a supplemental layer (not shown) or coating material that is reflective to some or all of the wavelengths falling outside the primary light absorption spectrum may be applied to external surface 34 of emitter 24. Thus, photons 52 with wavelengths in the supplemental light absorption spectrum that reach external surface 34 or the supplemental layer may be reflected back into, and thereby have a second opportunity to be absorbed by, optical downshifting layer 30.

In some embodiments, rear contact electrode 26 has an external surface 56 that may be coated with a material that is reflective to one or both of the primary light absorption and the supplemental absorption spectrum. Thus, in these spectra the photons that reach rear contact electrode 26 can be reflected back into photovoltaic material 22 and optical downshifting layer 30 with an opportunity to be absorbed.

In some embodiments, the supplemental layer, such as a passivation layer, can be added above optical downshifting layer 30 to act in place of or in addition to, supplemental layer 32, allowing optical downshifting layer 30 to act as an anti-reflective coating (ARC) instead of nitride, for example. The anti-reflective coating tool is currently the most expensive piece of equipment in the production line of standard solar cell platforms 20 and requires the most maintenance and associated infrastructure. Replacing the traditional anti-reflective coating with a low cost layer would measurably impact the cost of the producing solar cell platform 20 and the overall cost of solar cell 10. The passivation layer associated with optical downshifting layer 30 can replicate the effect of the anti-reflective coating to avoid the loss of efficiency otherwise afforded by the anti-reflective coating.

In some embodiments, a quantum dot heterostructure optical downshifting layer 30 can, itself, offer a lower reflectance and enhanced anti-reflective properties to solar cell platform 20 due to employment of an intermediate index of refraction in the matrix material containing the quantum dot heterostructures.

Additional processing and material costs for thin film quantum dot heterostructures as described above are low due to the low-temperature, solution-based deposition processes utilized. Therefore, the price of electricity per watt from solar cells 10 having a QDH optical downshifting layer 30 is substantially lower than the price of those without one.

Finally, lifetime concerns associated with the quantum dot heterostructure materials for optical downshifting layer 30 are substantially mitigated, since along with photovoltaic material 22, optical downshifting layer 30 undergoes the standard and well-understood encapsulation process into modules. As long as the QDH optical downshifting materials themselves are fundamentally stable, the solar cell 10 will have an operating lifetime that is comparable to the operating lifetimes (30+ years) of conventional silicon solar cell platforms 20.

A typical solar cell module based on silicon-containing solar cell platforms 20 has a 25-year warranty, so any additive or replacement material preferably has a similar longevity or at least a comparable one. Alternatively, the additive material can be shorter lived if it provides adequate benefit during its lifespan and is not detrimental thereafter. For example, if optical downshifting layer 30 lasts only 10 years, but contributes meaningfully to the power generation for those 10 years, such lifetime would be sufficient as long as optical downshifting layer did not block (such as become nontransmissive to wavelengths in the primary absorption spectrum) the solar cell platform 20 from performing its function after the first ten years. However, in the context of 25 years, a 1-2 year lifetime would not long be enough for most embodiments.

It will be obvious to those having skill in the art that many changes may be made to the details of the above-described embodiments without departing from the underlying principles of the invention. For example, skilled persons will appreciate that subject matter revealed in any sentence, paragraph, or embodiment can be combined with subject matter from some or all of the other sentences, paragraphs, or embodiments except where such combinations are mutually exclusive or inoperable. The scope of the present invention should, therefore, be determined only by the following claims.

What is claimed is:

1. An optical downshifting layer, comprising:
   a plurality of individually encapsulated non-spherical nanocrystals, each comprising a quantum dot heterostructure having a quantum dot core surrounded by a shell and individually encapsulated in a silica encapsulating material, wherein at least some of the plurality of individually encapsulated non-spherical nanocrystals comprise a quantum dot heterostructure having a quantum dot core surrounded by more than one shell;

the plurality of individually encapsulated non-spherical nanocrystals absorbing incident photons in a first wavelength range of the electromagnetic spectrum shorter than or equal to 600 nm, and emitting photons in a second wavelength range of the electromagnetic spectrum having a wavelength greater than 600 nm, such that the optical downshifting layer transforms the incident photons in the first wavelength range into photons in the second wavelength range of the electromagnetic spectrum.

2. The optical downshifting layer of claim 1, wherein the quantum dot heterostructure having a quantum dot core surrounded by a shell comprises a quantum dot heterostructures having a CdSe quantum dot core surrounded by a CdS shell.

3. The optical downshifting layer of claim 1, wherein the quantum dot heterostructure having a quantum dot core surrounded by a shell comprises a quantum dot heterostructure having a quantum dot core surrounded by a rod-shaped shell.

4. The optical downshifting layer of claim 1, wherein the plurality of individually encapsulated non-spherical nanocrystals, each comprising a quantum dot heterostructure, comprises a plurality of individually encapsulated non-spherical nanocrystals, each comprising a quantum dot heterostructure having a shape resembling a nanorod.

5. The optical downshifting layer of claim 1, wherein the plurality of individually encapsulated non-spherical nanocrystals, each comprising a quantum dot heterostructure, comprises a plurality of individually encapsulated non-spherical nanocrystals, each comprising one of at least two types of an individually encapsulated quantum dot heterostructure.

6. The optical downshifting layer of claim 1, wherein the plurality of individually encapsulated non-spherical nanocrystals absorbing incident photons in the first wavelength range of the electromagnetic spectrum comprise a plurality of individually encapsulated non-spherical nanocrystals absorbing incident photons in a wavelength range of 0.2 to 0.6 microns.

7. The optical downshifting layer of claim 1, wherein the first wavelength range of the electromagnetic spectrum is substantially outside of the second wavelength range of the electromagnetic spectrum.

8. The optical downshifting layer of claim 1, wherein a majority of the first wavelength range of the electromagnetic spectrum is outside of the second wavelength range of the electromagnetic spectrum.

9. The optical downshifting layer of claim 1, wherein the first wavelength range of the electromagnetic spectrum is completely outside of the second wavelength range of the electromagnetic spectrum.

10. The optical downshifting layer of claim 1, wherein the first wavelength range of the electromagnetic spectrum is separated from the second wavelength range of the electromagnetic spectrum such that the emitted photons in the second wavelength range of the electromagnetic spectrum are not substantially reabsorbed in the optical downshifting layer.

11. The optical downshifting layer of claim 1, wherein the optical downshifting layer is transmissive to incident photons in the second wavelength range of the electromagnetic spectrum such that they pass through the optical downshifting layer.

12. The optical downshifting layer of claim 1, wherein the plurality of individually encapsulated non-spherical nanocrystals are encapsulated in a polymer matrix material.

13. The optical downshifting layer of claim 1, wherein the plurality of individually encapsulated non-spherical nanocrystals are homogeneously dispersed in a matrix media.

* * * * *